US009197250B2

(12) United States Patent
Jeong et al.

(10) Patent No.: US 9,197,250 B2
(45) Date of Patent: *Nov. 24, 2015

(54) METHOD AND APPARATUS FOR CHANNEL CODING AND DECODING IN A COMMUNICATION SYSTEM USING A LOW-DENSITY PARITY-CHECK CODE

(71) Applicant: Samsung Electronics Co., Ltd., Gyeonggi-do (KR)

(72) Inventors: Hong-Sil Jeong, Seoul (KR); Sung-Ryul Yun, Gyeonggi-do (KR); Hyun-Koo Yang, Seoul (KR)

(73) Assignee: Samsung Electronics Co., Ltd (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/148,143

(22) Filed: Jan. 6, 2014

(65) Prior Publication Data

US 2014/0122961 A1 May 1, 2014

Related U.S. Application Data

(63) Continuation of application No. 13/103,640, filed on May 9, 2011, now Pat. No. 8,645,809.

(30) Foreign Application Priority Data

May 7, 2010 (KR) .......................... 10-2010-0043236

(51) Int. Cl.
*H03M 13/11* (2006.01)
*H03M 13/03* (2006.01)
(Continued)

(52) U.S. Cl.
CPC ........ *H03M 13/1148* (2013.01); *H03M 13/033* (2013.01); *H03M 13/1102* (2013.01);
(Continued)

(58) Field of Classification Search
CPC .......... H03M 13/033; H03M 13/1185; H03M 13/2906; H03M 13/618; H03M 13/6362; H03M 13/1102; H03M 13/1148; H03M 13/152
USPC .................................. 714/746, 758, 761, 790
See application file for complete search history.

(56) References Cited

U.S. PATENT DOCUMENTS 7,165,205 B2 * 1/2007 Blankenship et al. ........ 714/752
7,502,987 B2 * 3/2009 Kyung et al. ................. 714/781
(Continued)

FOREIGN PATENT DOCUMENTS

EP 2096760 9/2009
KR 1020050118056 12/2005
(Continued)

OTHER PUBLICATIONS

Lin Zhou; Baoming Bai; Ming Xu, "Design of Nonbinary Rate-Compatible LDPC Codes Utilizing Bit-Wise Shortening Method," Communications Letters, IEEE, vol. 14, No. 10, pp. 963, 965, Oct. 2010.*

(Continued)

*Primary Examiner* — Cynthia Britt
(74) *Attorney, Agent, or Firm* — The Farrell Law Firm, P.C.

(57) ABSTRACT

An apparatus and method are provided for channel coding in a communication system using a Low-Density Parity-Check (LDPC) code. The method includes determining degrees for each of a plurality of column groups of an information part; determining a shortening order based on the degrees; generating a parity check matrix based on the shortening order; and performing coding using the parity check matrix.

30 Claims, 15 Drawing Sheets

(51) Int. Cl.
*H03M 13/29* (2006.01)
*H03M 13/00* (2006.01)
*H03M 13/15* (2006.01)

(52) U.S. Cl.
CPC ...... *H03M13/1185* (2013.01); *H03M 13/2906* (2013.01); *H03M 13/618* (2013.01); *H03M 13/6362* (2013.01); *H03M 13/152* (2013.01)

(56) References Cited

U.S. PATENT DOCUMENTS

| | | | |
|---|---|---|---|
| 7,890,844 B2* | 2/2011 | Jeong et al. | 714/784 |
| 8,433,984 B2* | 4/2013 | Khandekar et al. | 714/779 |
| 2005/0283708 A1 | 12/2005 | Kyung et al. | |
| 2007/0058676 A1* | 3/2007 | Lim et al. | 370/468 |
| 2009/0164864 A1 | 6/2009 | Matsumoto et al. | |
| 2009/0217129 A1 | 8/2009 | Myung et al. | |
| 2009/0217130 A1 | 8/2009 | Myung et al. | |
| 2009/0259915 A1 | 10/2009 | Livshitz et al. | |
| 2011/0138262 A1 | 6/2011 | Myung et al. | |
| 2011/0276855 A1 | 11/2011 | Jeong et al. | |

FOREIGN PATENT DOCUMENTS

| | | |
|---|---|---|
| KR | 1020080077992 | 8/2008 |
| KR | 1020090092196 | 8/2009 |
| KR | 1020090092197 | 8/2009 |

OTHER PUBLICATIONS

Lin Zhou; Baoming Bai; Ming Xu; Chao Chen, "Bit-wise shortening of nonbinary LDPC codes using their binary images," Communications and Networking in China, 2009. ChinaCOM 2009. Fourth International Conference on , vol., No., pp. 1,3, Aug. 26-28, 2009.*

Vila Casado, A.I.: Wen-Yen Weng; Wesel, R.D., "Multiple rate low-density parity-check codes with constant blocklength," Signals, Systems and Computers, 2004. Conference Record of the Thirty-Eighth Asilomar Conference on, vol. 2, No., pp. 2010, 2014 vol. 2, Nov. 7-10, 2004.

Jacobsen, N.; Soni, R., "Design of Rate-Compatible Irregular LDPC Codes Based on Edge Growth and Parity Splitting, "Vehicular Technology Conference, 2007. VTC-2007 Fall 2007 IEEE 66th, vol., No., pp. 1052, 1056, Sep. 30 2007 Oct. 3 2007.

Tao Tian et al., "Construction of Rate-Compatible LDPC Codes Utilizing Information Shortening and Parity Puncturing", EURASIP Journal on Wireless Communications and Networking, Oct. 5, 2005.

Konstantinos Liolis et al., DVB-RCS Mobile: "Further Simulation Results on DVB-S2 LDPC Code Shortening for Latency Reduction in SCPC-based Return Link", Dec. 7, 2007.

Hyo Yol Park et al., "Structured Puncturing for Rate-Compatible B-LDPC Codes with Dual-Diagonal Parity Structure", XP-002711770, IEEE Transactions on Wireless Communications, vol. 7, No. 10, Oct. 2008.

* cited by examiner

METHOD AND APPARATUS FOR CHANNEL CODING AND DECODING IN A COMMUNICATION SYSTEM USING A LOW-DENSITY PARITY-CHECK CODE

PRIORITY

This application is a Continuation of U.S. patent application Ser. No. 13/103,640, which was filed in the U.S. Patent and Trademark Office on May 9, 2011, and claims priority under 35 U.S.C. §119(a) to Korean Patent Application Serial No. 10-2010-0043236, which was filed in the Korean Intellectual Property Office on May 7, 2010, the entire disclosure of each of which is hereby incorporated by reference.

BACKGROUND OF THE INVENTION

1. Field of the Invention

The present invention relates generally to a communication system using linear block codes, and more particularly, to a channel coding and decoding method and apparatus for generating specific types of linear block codes

2. Description of the Related Art

A Low-Density Parity-Check (LDPC) code, which is a type of linear block code, may be expressed using a bipartite graph, which is generally defined as a parity check matrix and referred to as a Tanner graph. The bipartite graph is a graph whose vertexes are divided into two different types. The LDPC code is expressed with a bipartite graph including vertexes called variable nodes and check nodes. The variable nodes correspond to coded bits on a one-to-one basis.

FIG. 1 illustrates an example of a parity check matrix $H_1$ of an LDPC code including 4 rows and 8 columns.

Referring to FIG. 1, the parity check matrix $H_1$ generates a codeword with a length of 8 because it has 8 columns. A code generated using the parity check matrix $H_1$ is an LDPC code, and its columns correspond to 8 coded bits.

FIG. 2 illustrates a Tanner graph corresponding to the parity check matrix $H_1$ in FIG. 1.

Referring to FIG. 2, the Tanner graph for the LDPC code includes 8 variable nodes $x_1$ 202, $x_2$ 204, $x_3$ 206, $x_4$ 208, $x_5$ 210, $x_6$ 212, $x_7$ 214, and $x_8$ 216, and 4 check nodes 218, 220, 222, and 224. An i-th column and a j-th row of the parity check matrix $H_1$ of the LDPC code correspond to a variable node X, and a j-th check node, respectively. A value of 1 (i.e., a non-zero value) in a point where an i-th column and a j-th row of the parity check matrix $H_1$ of the LDPC code cross each other, indicates the existence of an edge connecting the variable node $X_i$ to the j-th check node on the Tanner graph in FIG. 2.

In the Tanner graph for the LDPC code, a degree of a variable node or a check node indicates the number of edges connected to the node, and is equal to the number of non-zero entries in a column or a row corresponding to the node in the parity check matrix. For example, in FIG. 2, degrees of the variable nodes $x_1$ 202, $x_2$ 204, $x_3$ 206, $x_4$ 208, $x_5$ 210, $x_6$ 212, $x_7$ 214, and $x_8$ 216 are 4, 3, 3, 3, 2, 2, 2, and 2, respectively, and degrees of the check nodes 218, 220, 222, and 224 are 6, 5, 5, and 5, respectively. The numbers of non-zero entries in columns of the parity check matrix $H_1$ in FIG. 1, which correspond to the variable nodes in FIG. 2, are equal to the degrees 4, 3, 3, 3, 2, 2, 2, and 2 of the variable nodes on a one-to-one basis, and the numbers of non-zero entries in rows of the parity check matrix $H_1$ in FIG. 1, which correspond to the check nodes in FIG. 2, are equal to the degrees 6, 5, 5, and 5 of the check nodes on a one-to-one basis.

Therefore, it can be understood that an i-th codeword bit $c_i$, an i-th column $h_i$ in the parity check matrix, and an i-th variable node $x_i$ on the Tanner graph correspond to one another.

FIG. 3 is a diagram schematically illustrating a structure of an LDPC code.

Referring to FIG. 3, $N_1$ represents a length of an LDPC codeword, and is equal to a length of the parity check matrix. $K_1$ represents a length of an information word, and is equal to a length of an information part of the parity check matrix. $(N_1-K_1)$ represents a length of parity bits, and is equal to a length of a parity part of the parity check matrix. In addition, integers $M_1$ and q are determined to meet $q=(N_1-K_1)/M_1$. $K_1/M_1$ may also be an integer. For convenience, the parity check matrix in FIG. 3 will be assumed to be a first parity check matrix $H_1$.

Positions with a weight of 1 in the portion of $K_1$-th to $(N_1-1)$-th columns, which corresponds to the parity part in the parity check matrix of FIG. 3, have a dual diagonal structure. Therefore, all columns corresponding to the parity part, except for the $(N_1-1)$-th column, have a degree of 2, and the $(N_1-1)$-th column has a degree of 1.

A structure of the portion of 0-th to $(K_1-1)$-th columns, which corresponds to the information part of the parity check matrix, is made according to the following rules.

Rule 1: A total of $K_1/M_1$ column groups are made by grouping $K_1$ columns corresponding to the information word in the parity check matrix into a plurality of groups each including $M_1$ columns. Columns in each column group are made according to the following Rule 2.

Rule 2: First, a position with a weight of 1 in a 0-th column in an i-th column group (where $i=0, 1, \ldots, K_1/M_1-1$) is determined. Second, a degree of an 0-th column in an i-th column group is defined as $D_i$. Assuming that positions of rows with a weight of 1 are $R_{i,0}^{(1)}, R_{i,0}^{(2)}, \ldots, R_{i,0}^{(D_i)}$, a position $R_{i,j}^{(k)}$ (for $k=1, 2, \ldots, D_i$) of a row with a weight of 1 in a j-th column (where $j=1, 2, \ldots, M_1-1$) in an i-th column group is defined as shown in Equation (1) below.

$$R_{i,j}^{(k)} = R_{i,(j-1)}^{(k)} + q \bmod(N_1-K_1)$$

$$k=1,2,\ldots,D_i, i=0,1,\ldots,K_1/M_1-1, j=1,2,\ldots,M_1-1 \quad (1)$$

According to Rule 2, all columns in an i-th column group (where $i=0, 1, \ldots, K_1/M_1-1$) have the same degree of $D_i$.

For a better understanding of the LDPC code as illustrated in FIG. 3, which stores information about the parity check matrix according to the above Rule 2, the following specific example will be considered.

In a parity check matrix with $N_1=30$, $K_1=15$, $M_1=5$ and $q=3$, for 0-th columns in 3 column groups, 3 sequences regarding positions of rows with a weight of 1 may be represented as follows. These sequences will be referred to as 'weight-1 position sequences'.

$R_{1,0}^{(1)}=1, R_{1,0}^{(2)}=2, R_{1,0}^{(3)}=8, R_{1,0}^{(4)}=10,$ $R_{2,0}^{(1)}=0, R_{2,0}^{(2)}=9, R_{2,0}^{(3)}=13,$ $R_{3,0}^{(1)}=0, R_{3,0}^{(2)}=14.$

For convenience, as to information about rows with a weight of 1 for 0-th columns in the above column groups, only associated position information will be represented on a column group basis as follows:

0 1 2 8 10

0 9 13

0 14

In other words, a sequence of an i-th column group sequentially represents information about rows with a weight of 1 in a 0-th column in an i-th column group.

The LDPC code may be coded generally by a formula in which the results of binary multiplication on the parity check matrix H and the codeword c become a zero (0) matrix.

FIG. 4 is a diagram illustrating an example of a parity check matrix of an LDPC code.

By constructing a parity check matrix using the information associated with the above specific example and Rules 1 and 2, an LDPC code having the same concept as the LDPC code illustrated in FIG. 3 may be generated as illustrated in FIG. 4.

Coding Method of LDPC Code

For convenience of description, information bits (or information word bits) with a length of $K_1$ are represented as $(i_0, i_1, \ldots, i_{K_1-1})$, and parity bits with a length of $(N_1-K_1)$ are represented as $(p_0, p_1, \ldots, p_{N_1-K_1-1})$. An LDPC code has the characteristics of $N_1=16200$, $K_1=10800$, $M_1=360$, and $q=15$.

Step 1: A controller initializes parity bits, as follows:

$$p_0 = p_1 = \ldots = p_{N_1-K_1-1} = 0$$

Step 2: The controller reads information about rows with a weight of 1 in a 0-th column in a first column group of an information part from stored information about the parity check matrix, as follows:

$$R_{1,0}^{(1)}=0, R_{1,0}^{(2)}=2084, R_{1,0}^{(3)}=1613, R_{1,0}^{(4)}=1548,$$

$$R_{1,0}^{(5)}=1286, R_{1,0}^{(6)}=1460, R_{1,0}^{(7)}=3196, R_{1,0}^{(8)}=4297,$$

$$R_{1,0}^{(9)}=2481, R_{1,0}^{(10)}=3369, R_{1,0}^{(11)}=3451, R_{1,0}^{(12)}=4620,$$

$$R_{1,0}^{(13)}=2622$$

Using the read information and an information bit $i_0$, specific parity bits $p_x$ are updated as shown in Equation (2) below.

$$p_0 = p_0 \oplus i_0, p_{2084} = p_{2084} \oplus i_0, p_{1618} = p_{1618} \oplus i_0,$$

$$p_{1548} = p_{1548} \oplus i_0, p_{1286} = p_{1286} \oplus i_0, p_{1460} = p_{1460} \oplus i_0,$$

$$p_{8196} = p_{8196} \oplus i_0, p_{4297} = p_{4297} \oplus i_0, p_{2481} = p_{2481} \oplus i_0,$$

$$p_{3369} = p_{3369} \oplus i_0, p_{3451} = p_{3451} \oplus i_0, p_{4620} = p_{4620} \oplus i_0,$$

$$p_{2622} = p_{2622} \oplus i_0 \qquad (2)$$

In Equation (2), x represents $R_{1,0}^{(k)}$ for k=1, 2, ..., 13, $\oplus$ represents binary addition, and $p_x = p_x \oplus i_0$ may be expressed as $p_x \leftarrow p_x \oplus i_0$.

Step 3: For the next 359 information bits $i_1, i_2, \ldots, i_{359}$ following the information bit $i_0$, values are calculated using Equation (3) below.

$$\{x+(m \bmod M_1)\times q\} \bmod(N_1-K_1), m=1,2,\ldots,359 \qquad (3)$$

In Equation (3), x represents $R_{1,0}^{(k)}$ for k=1, 2, ..., 13. It is to be noted that Equation (3) is equal in concept to Equation (1).

Next, a similar operation to Equation (2) is performed using the values calculated in Equation (3). In other words, for $i_m$, $p_{\{x+(m \bmod M_1\times q)\} \bmod(N_1-K_1)}$ is updated. For example, for m=1, i.e., for $i_1$, $p_{(x+q) \bmod(N_1-K_1)}$ is updated as shown in Equation (4) below.

$$p_{15} = p_{15} \oplus i_1, p_{2099} = p_{2099} \oplus i_1, p_{1628} = p_{1628} \oplus i_1,$$

$$p_{1568} = p_{1568} \oplus i_1, p_{1301} = p_{1301} \oplus i_1, p_{1475} = p_{1475} \oplus i_1,$$

$$p_{3211} = p_{3211} \oplus i_1, p_{4312} = p_{4312} \oplus i_1, p_{2496} = p_{2496} \oplus i_1,$$

$$p_{3384} = p_{3384} \oplus i_1, p_{3466} = p_{3466} \oplus i_1, p_{4635} = p_{4635} \oplus i_1,$$

$$p_{2637} = p_{2637} \oplus i_1 \qquad (4)$$

In Equation (4), q=15. The above process is performed in the same way, for m=1, 2, ..., 359.

Step 4: As in Step 2, for an information bit $i_{361}$, information of $R_{2,0}^{(k)}$ (for k=1, 2, ..., 13) is read and a specific $p_x$ is updated, where x represents $R_{2,0}^{(k)}$. For the next 359 information bits $i_{361}, i_{362}, \ldots, i_{719}$ following the information bit $i_{360}$, $p_{\{x+(m \bmod M_1\times q)\} \bmod(N_1-K_1)}$ (for m=361, 362, ..., 719) is updated by applying Equation (3) in a similar way.

Step 5: For all of 360 information bit groups, Steps 2, 3 and 4 are repeated. Finally, parity bits are determined using Equation (5) below.

$$p_i = p_i \oplus p_{i-1}, i=1,2,\ldots,N_1-K_1-1 \qquad (5)$$

In Equation (5), $P_i$ represents LDPC-coded parity bits.

In the above LDPC coding method, coding is performed through Steps 1 to 5.

In order to apply an LDPC code to an actual communication system, the LDPC code should be designed to be appropriate for a data rate required in the communication system. Particularly, not only in an adaptive communication system using Hybrid Automatic Retransmission reQuest (HARQ) and Adaptive Modulation and Coding (AMC), but also in a communication system supporting various broadcast services, LDPC codes having various codeword lengths are used to support various data rates according to the requirements of the systems.

To support the LDPC codes having various codeword lengths, puncturing and shortening methods may be used. There are several possible shortening methods, one of which inserts '0' or '1' into some of information bits and avoids transmitting the inserted '0' or '1'. The puncturing avoids transmitting a portion of a generated codeword. By designing a parity check matrix taking into account all of the puncturing and shortening methods and the structure of a parity check matrix having undergone shortening, its performance may be optimized for a plurality of codeword lengths. Accordingly, research is needed on the design method.

SUMMARY OF THE INVENTION

An aspect of the present invention is to provide a channel coding and decoding method and apparatus for generating a parity check matrix to generate linear block codes having various codeword lengths in a communication system using an LDPC code.

Another aspect of the present invention is to provide a channel coding and decoding method and apparatus for generating an LDPC code with a different codeword length from a given LDPC code by shortening or puncturing in a communication system using an LDPC code.

Another aspect of the present invention is to provide a channel coding and decoding method and apparatus optimizing performance of an LDPC code taking into account its structure in a communication system using an LDPC code having a specific structure.

In accordance with an aspect of the present invention, a method is provided for channel coding in a communication system using an LDPC code. The method includes determining degrees for each of a plurality of column groups of an information part; determining a shortening order based on the degrees; generating a parity check matrix based on the shortening order; and performing coding using the parity check matrix.

In accordance with another aspect of the present invention, an apparatus is provided for channel coding in a communication system using an LDPC code. The apparatus includes a controller for determining degrees for each of a plurality of column groups of an information part, and determining a shortening order based on the degrees; and a coder for generating a parity check matrix based on the shortening order, and performing coding using the parity check matrix.

In accordance with another aspect of the present invention, a method is provided for channel decoding in a communication system using an LDPC code. The method includes receiving a coded signal from a transmitter; and decoding the received signal using a parity check matrix. The parity check matrix is generated by determining degrees for each of a plurality of column groups of an information part, and determining a shortening order based on the degrees.

In accordance with another aspect of the present invention, an apparatus is provided for channel decoding in a communication system using an LDPC code. The apparatus includes a receiver for receiving a coded signal from a transmitter; and a decoder for decoding the received signal using a parity check matrix. The parity check matrix is generated by determining degrees for each of a plurality of column groups of an information part, and determining a shortening order based on the degrees.

BRIEF DESCRIPTION OF THE DRAWINGS

The above and other aspects, features, and advantages of certain embodiments of the present invention will be more apparent from the following description taken in conjunction with the accompanying drawings, in which:

FIG. 4 is a diagram illustrating an example of a parity check matrix of an LDPC code;

FIG. 8 illustrates an information part of an LDPC code;

FIG. 11 illustrates a parity check matrix, wherein the number of rows with a weight of 1 in each column is 1 (i=1) in a column group of an information part, according to an embodiment of the present invention;

FIG. 12 illustrates a parity check matrix in which 4 parity groups of a parity part are added when the number of rows with a weight of 1 in each column is 2 (i=2) in a column group of an information part, according to an embodiment of the present invention;

FIG. 13 illustrates a parity check matrix in which a column group $C_0$ of an information part is added, based on the parity check matrix illustrated in FIG. 12, according to an embodiment of the present invention;

Throughout the drawings, the same drawing reference numerals will be understood to refer to the same elements, features and structures.

DETAILED DESCRIPTION OF EMBODIMENTS OF THE INVENTION

Various embodiments of the present invention will now be described in detail below with reference to the accompanying drawings. In the following description, specific details such as detailed configuration and components are merely provided to assist the overall understanding of certain embodiments of the present invention. Therefore, it should be apparent to those skilled in the art that various changes and modifications of the embodiments described herein can be made without departing from the scope and spirit of the invention. In addition, descriptions of well-known functions and constructions are omitted for clarity and conciseness.

To support various block lengths, puncturing and/or shortening methods are used. As described above, a shortening method is to insert '0' or '1' into information bits or a bit group, and avoid transmitting the inserted '0' or '1'. The information bits correspond to an information part of a parity check matrix, and the bit group indicates a group of information bits corresponding to its associated column group of the parity check matrix. The shortening method refers to a method of not using a specific portion of a given parity check matrix, or of using only the specific portion. The puncturing method refers to a method of generating an LDPC codeword by LDPC coding a given specific parity check matrix, and then avoiding transmitting a specific portion of the LDPC codeword. Therefore, a receiver determines the non-transmitted portion as an erased portion.

For a better understanding of the puncturing method, the parity check matrixes of the LDPC codes in FIGS. 3 and 4 will be described in more detail. Additionally, although various embodiments of the present invention will be described below based on the LDPC code, the present invention is not limited to the LDPC code.

Figures 1, 2:
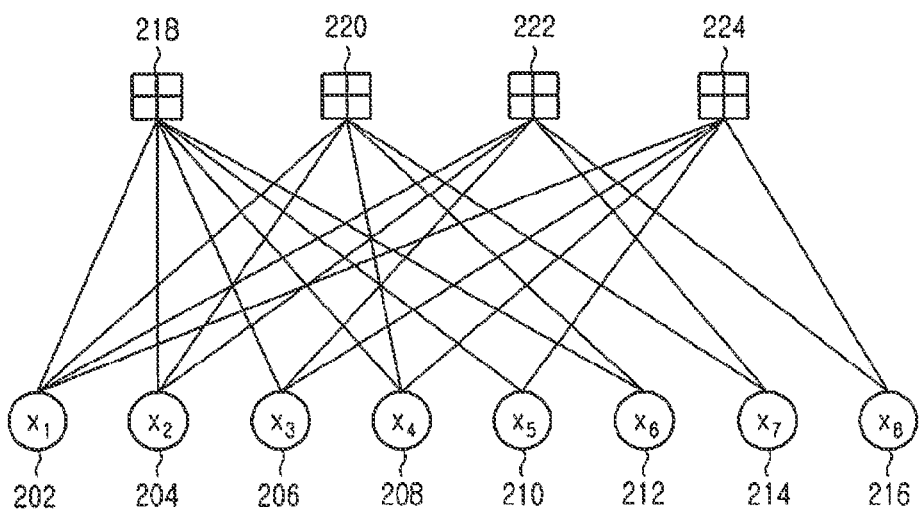
FIG. 1 is a diagram illustrating an example of a parity check matrix of an LDPC code with a length of 8.
FIG. 2 is a diagram illustrating a Tanner graph for a parity check matrix of an LDPC code with a length of 8.
Figure 3:
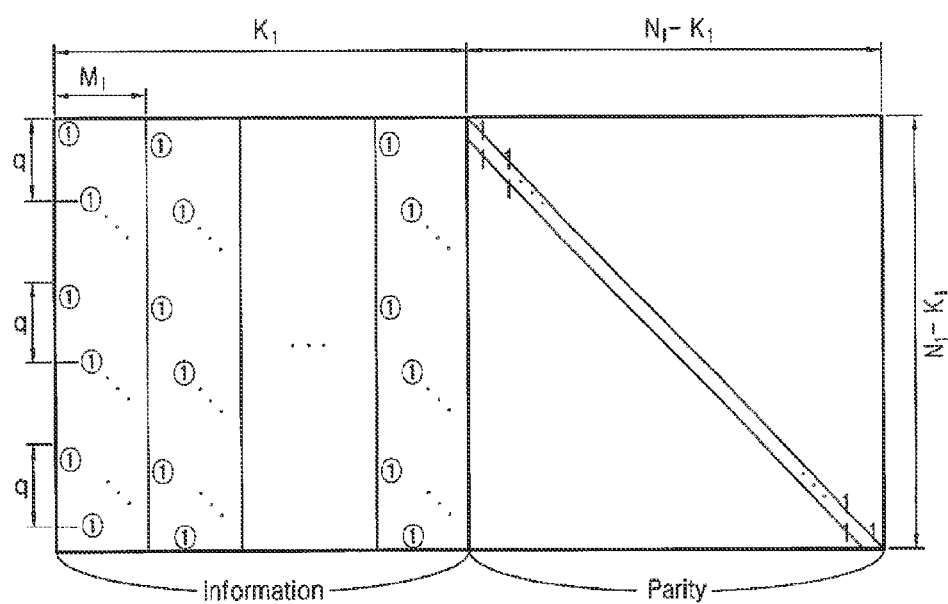
FIG. 3 is a diagram schematically illustrating a structure of an LDPC code.

The full length of the parity check matrix of the LDPC code in FIG. 3 is $N_1$, and a front portion of the parity check matrix corresponds to information bits $(i_0, i_1, \ldots, i_{K_1-1})$ with a length of $K_1$, while a rear portion of the parity check matrix corresponds to parity bits $(p_0, p_1, \ldots, p_{N_1-K_1-1})$ with a length of $(N_1-K_1)$. The information bits correspond to an information part of the parity check matrix, and a bit group refers to a group of information bits corresponding to its associated column group of the parity check matrix.

The puncturing method may be applied generally to both the information bits and the parity bits. Although the puncturing and shortening methods are equal in that they reduce a length of the LDPC code, the puncturing method does not limit values of specific bits, unlike the shortening method. The puncturing method merely avoids transmitting a specific portion of specific information bits or generated parity bits so that a receiver may regard the non-transmitted portion as an erased portion. Because position information of the punctured bits may be shared or estimated by a transmitter and a receiver during system setup, the receiver may consider the punctured bits as erased bits during decoding.

The puncturing and shortening methods for the LDPC code will now be described. The LDPC code used in the shortening method has a specific structure. Therefore, unlike a general LDPC code, this LDPC code may undergo shortening and puncturing more efficiently.

For convenience of description, assume that a desired LDPC code finally obtained from an LDPC code with a codeword length of $N_1$ and an information word length of $K_1$, by shortening and puncturing, has a codeword length of $N_2$ and an information word length of $K_2$. Assuming that $N_1-N_2=N_A$ and $K_1-K_2=K_A$, the LDPC code with a codeword length of $N_2$ and an information word length of $K_2$ may be generated by shortening $K_A$ bits and puncturing $N_p (=N_A-K_A)$ bits from the given parity check matrix of the LDPC code. For the generated LDPC code, when $N_A>0$ or $K_A>0$, its coding rate is $K_A>0$, which is different from a coding rate $K_1/N_1$ of the general LDPC code, causing a change in algebraic properties. When $N_A=K_A$, none of shortening and puncturing are performed, or only shortening is performed.

Characteristics of the LDPC code, parity bits of which have undergone puncturing, will be described in detail with reference to FIG. 4. For the LDPC code in FIG. 4, $N_1=30$, $K_1=15$, $M_1=5$ and $q=3$, and position information of rows with a weight of 1 in 0-th columns in 3 column groups is as follows.

0 1 2
0 11 13
0 10 14

An i-th weight-1 position sequence in an i-th column sequentially represents position information of rows with a weight of 1 in a 0-th column in an i-th column group.

Figure 4:
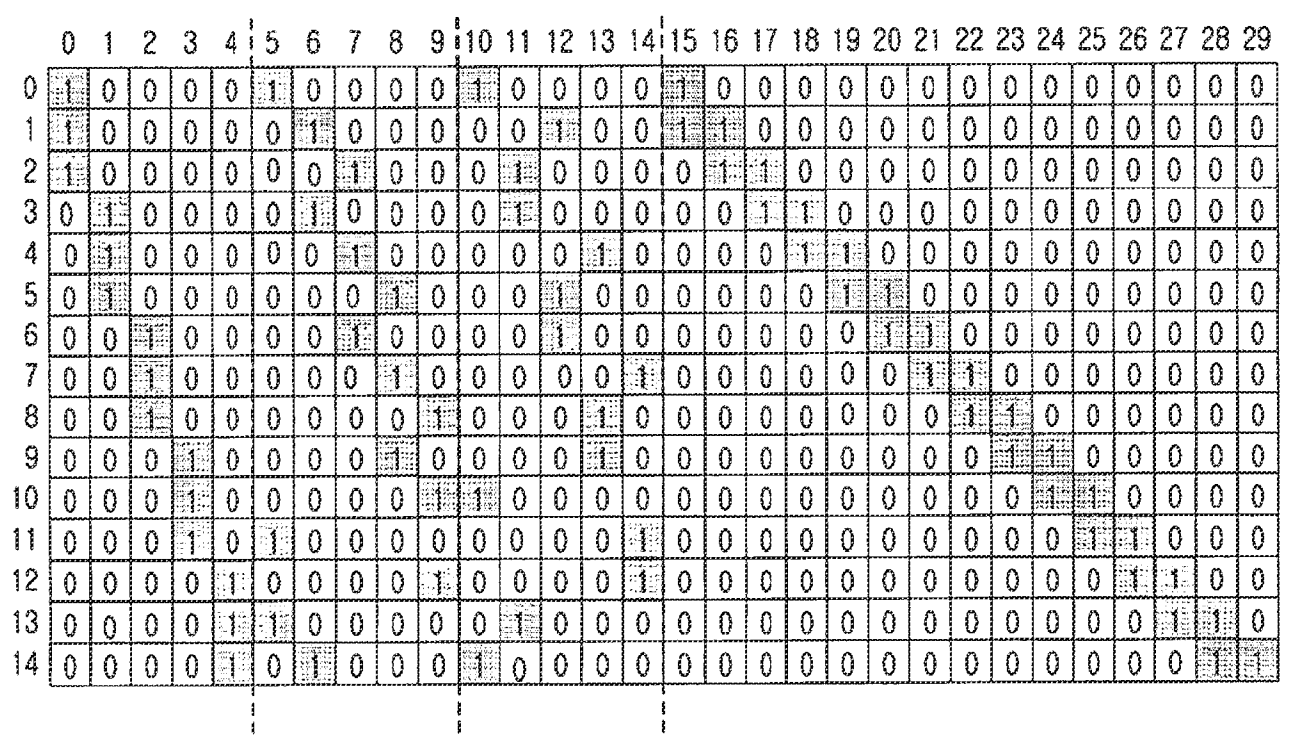
Figure 5:
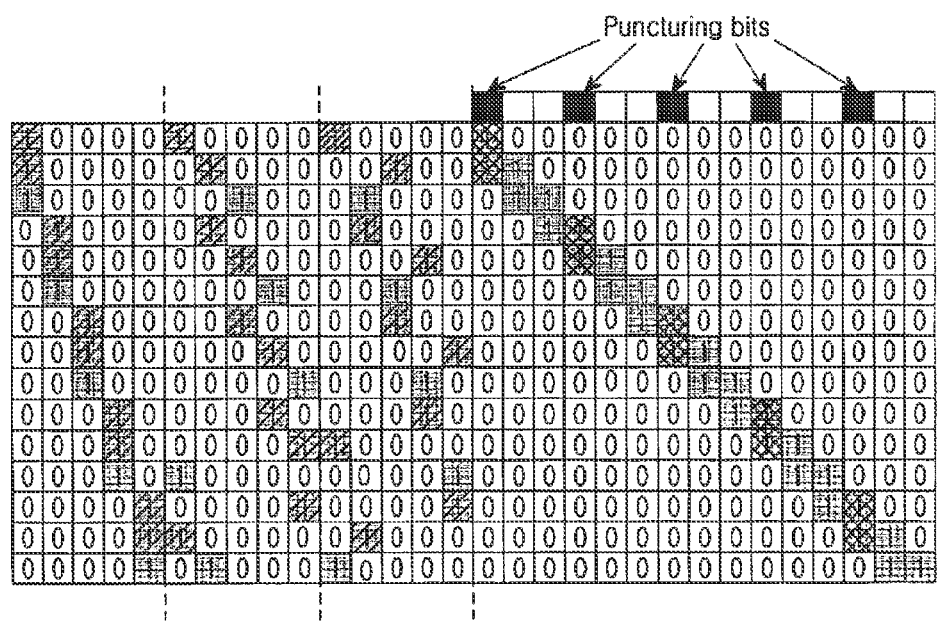
FIG. 5 illustrates the generation of an LDPC code with a different codeword length from a parity check matrix of a given LDPC code according to an embodiment of the present invention.

FIG. 5 illustrates the generation of an LDPC code with a different codeword length from a parity check matrix of a given LDPC code according to an embodiment of the present invention. Specifically, FIG. 5 illustrates an example of the LDPC code in FIG. 4, to which regular puncturing is applied.

Referring to FIG. 5, a puncturing pattern is applied to the parity check matrix in FIG. 4. The puncturing pattern maintains 3 bit interval between parity bits punctured from q=3, one of the configuration variables. As can be seen in FIG. 5, information bits corresponding to all column groups are connected to two punctured bits in the same way.

The reason why the abnormality between punctured bits and information bits is significantly reduced by setting the interval between punctured parity bits according to the value of q, can be found from the structure of the LDPC code. For its description, FIG. 3 will be considered.

Referring to Rules 1 and 2 and FIG. 3, in each column group, a position with a weight of 1 in a first column determines a position with a weight of 1 in the other columns. Indexes of rows with a weight of 1 in the other columns are different from an index of a row with a weight of 1 in the first column by a multiple of q, for modulo $(N_1-K_1)$, where $N_1$ represents an LDPC codeword length and $K_1$ represents an information word length. More specifically, indexes of rows with a weight of 1 in two consecutive columns among the columns of a parity check matrix, which correspond to a specific parity part, are different from each other by q, for modulo $(N_1-K_1)$.

Another LDPC code is characterized by a submatrix corresponding to a parity part in its parity check matrix. Referring again to FIG. 3, the parity part has a structure of a lower triangular matrix in which 1 exists along the full diagonal portion, and an i-th parity bit corresponds to 1 in an i-th row.

Assuming that a certain specific parity was punctured from these systematic characteristics of the LDPC code, if puncturing is repeated by an interval of q, variable nodes on the Tanner graph, which correspond to the parity bits punctured in a specific parity group, and variable nodes on the Tanner graph, which correspond to the information bits shortened in the information part, are as regular as possible in terms of the number of edges.

For example, assuming that an i-th parity bit in a specific parity group is punctured for $0 \leq i < q$, and an (i+kq)-th parity bit is repeated punctured for $0 \leq k < M_1$, if a variable node on the Tanner graph, which corresponds to an information bit, is connected to a variable node on the Tanner graph, which corresponds to an i-th parity bit, 1 exists in an i-th row in a column corresponding to the information bit in the parity check matrix. Therefore, it can be understood that 1 exists in an (i+kq)-th row in a column corresponding to an information bit spaced apart from the information bit by k, among the columns corresponding to the information part in the parity check matrix. Thus, the information bit is connected to the punctured (i+kq)-th parity bit.

For the LDPC code, because in columns of one parity check matrix, variable nodes corresponding to the entire information word are equal in degree and less than one 1 is distributed in one row, if the puncturing pattern is applied, information bits corresponding to columns in one parity check matrix are connected to the same number of punctured bits. Therefore, the connection between the punctured bits and the information bits may be regular, ensuring stable decoding in the decoding process.

Therefore, it is possible to determine a parity group to be punctured and determine the order of the parity group. Assuming that $(N_1-K_1)$ parity bits are $\{p_0, p_1, p_2, \ldots, p_{N_1-K_1-1}\}$, a j-th parity group including q entries may be made using Equation (6) below.

$$P_j = \{p_k | k \bmod q = j, 0 \leq k < N_1-K_1\} \text{ for } 0 \leq j < q \qquad (6)$$

Figure 6:
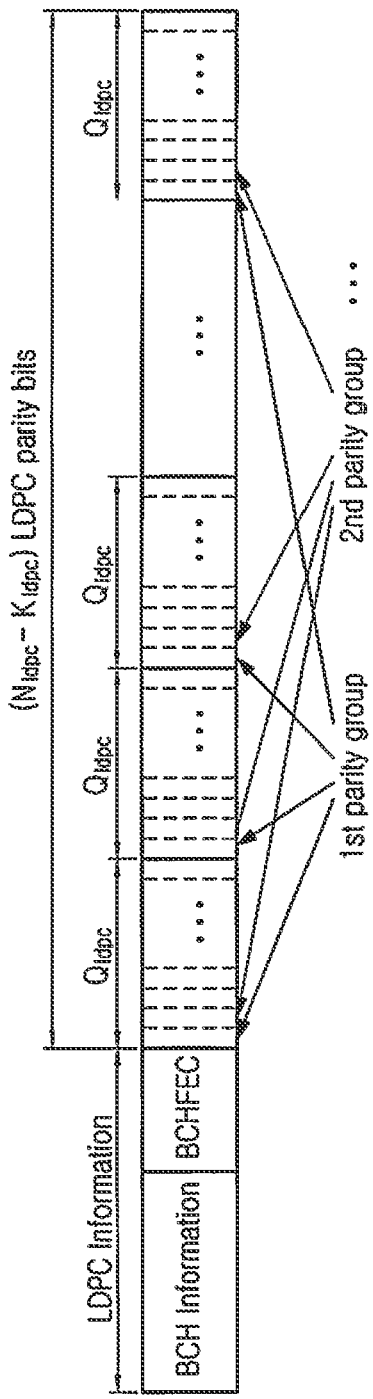
FIG. 6 illustrates an LDPC code according to an embodiment of the present invention.

FIG. 6 illustrates an example of a structure of an LDPC code according to an embodiment of the present invention. The parity group will be described with reference to FIG. 6.

The parity group may be expressed in different ways. For example, the parity group may be made after only the parity bits are interleaved. Parity bits may be interleaved as follows. If a codeword obtained after interleaving an original codeword $C=\{c_0, c_1, c_2, \ldots, c_{N_1}\}$ is $\tilde{C}=\{\tilde{c}_0, \tilde{c}_1, \tilde{c}_2, \ldots, \tilde{c}_{N_1}\}$, then the following Equation (7) is met.

$$\tilde{c}_i = c_i \text{ for } 0 \leq i < K_1 \text{ (information part noninterleaved)}$$

$$\tilde{c}_{K_1+Mt+s} = c_{K_1+qs+t} \text{ for } 0 \leq s < M, 0 \leq t < q \qquad (7)$$

The parity group obtained after interleaving parity bits is defined as shown Equation (8) below.

$$P_j = \{p_k | (j-1)M \leq k < jM, 0 \leq k < (N_1-K_1)\} \text{ for } 0 \leq j < q \qquad (8)$$

Figure 7:
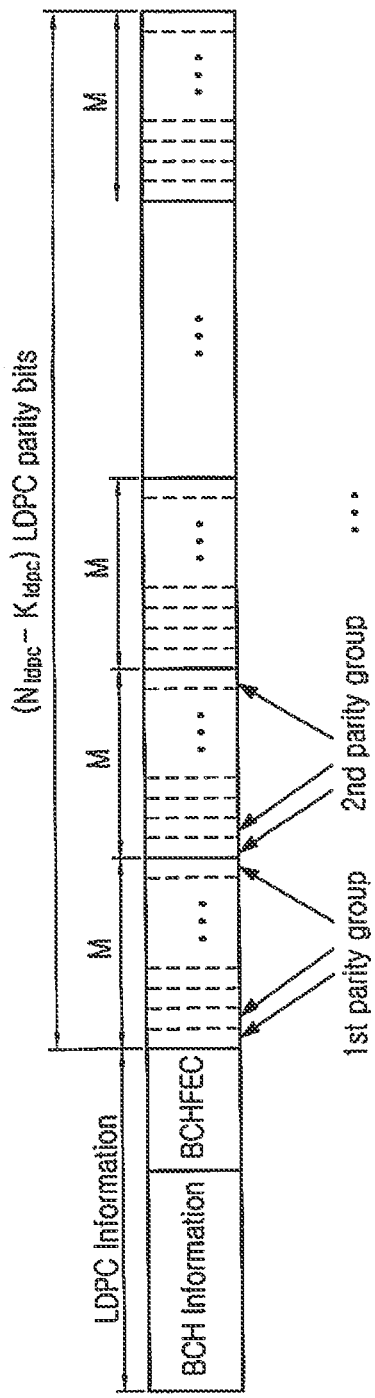
FIG. 7 illustrates an LDPC code according to an embodiment of the present invention.

FIG. 7 illustrates another example of a structure of an LDPC code according to an embodiment of the present invention. The parity group will also be described with reference to FIG. 7.

Assuming that the number of bits undergoing puncturing is determined, a first specific column group fully undergoes puncturing according to the predetermined order. If there are any remaining bits to be punctured, columns corresponding to a predetermined second specific parity group in the parity check matrix fully undergoes puncturing. If there are still any remaining bits to be punctured, a predetermined third specific column group fully undergoes puncturing. This process is repeated, and if the number of remaining bits to be punctured is less than the size $M_1$ of one column group, a portion of the column group is punctured, completing the puncturing process. The predetermined puncturing order is called a puncturing pattern, which is denoted by indexes of the columns.

For the LDPC code, as described with reference to Rules 1 and 2, values of $R_{i,j}^{(k)}$ (for k=1, 2, ..., $D_i$, i=1, ..., $K_1/M_1$, j=0, ..., $M_1-1$) correspond to $M_1$ columns corresponding to an information word of the parity check matrix in a submatrix, making a total of $K_1/M_1$ systematic column groups. However, as the LDPC code is generally concatenated to a Bose-Chaudhuri-Hocquenghem (BCH) code as illustrated in FIG. 8, an information word 831 of the LDPC code may be subdivided into a part corresponding to a BCH information word 833 and a part corresponding to a BCH parity 835.

Figure 8:
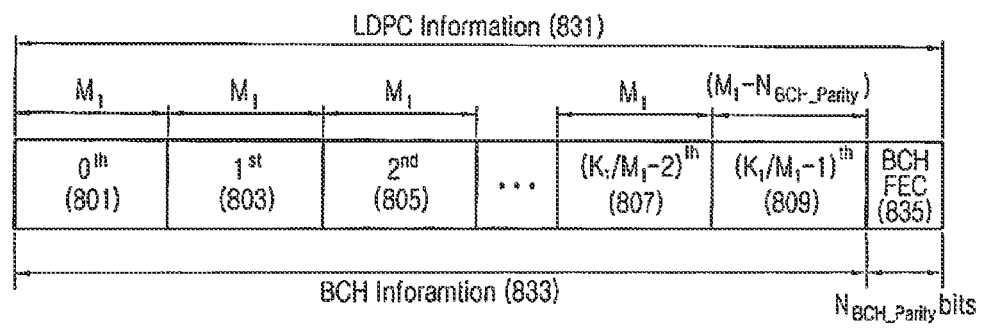

Referring to FIG. 8, if a length of the BCH parity 835 corresponding to the end portion of the last $(K_1/M_1-1)$-th column group is defined as $N_{BCH\_parity}$, a length of the BCH information word 833 is $(K_1-N_{BCH\_parity})$. Because the BCH parity 835 is determined by the information word 831, a length of an information word, which is actually adjustable in a system employing the LDPC coding method, is $(K_1-N_{BCH\_parity})$. Therefore, the BCH parity bits 835 with a length of $N_{BCH\_Parity}$ may not undergo shortening. When the BCH code is not used, it is natural that $N_{BCH\_parity}=0$.

Because the LDPC code has a special structure designed on a column group basis, it is beneficial that when necessary, the LDPC code undergoes column-group by column-group shortening rather than bit by bit shortening, to achieve superior performance.

Figure 9:
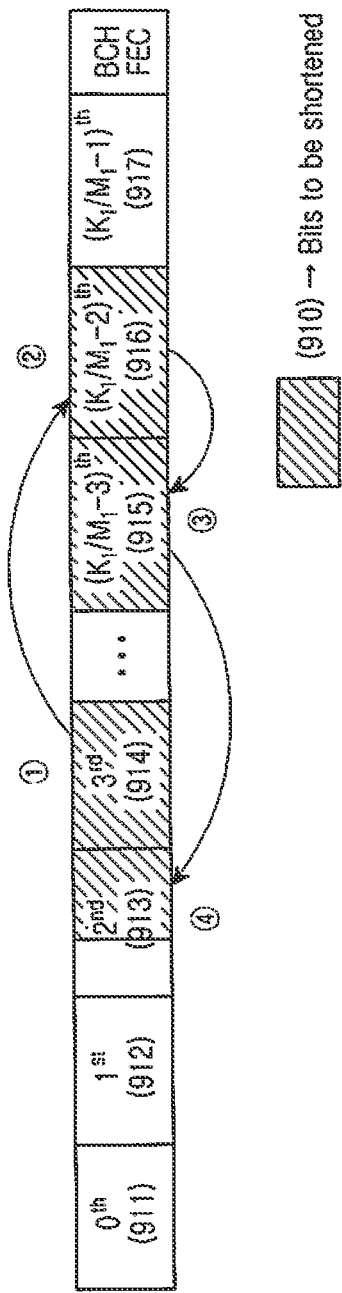
FIG. 9 illustrates of column-group by column-group shortening on an LDPC code.

FIG. 9 illustrates an example of column-group by column-group shortening on an LDPC code according to an embodiment of the present invention. In FIG. 9, a shaded portion 910 indicates bits being shortened.

After the number of bits undergoing shortening is determined, a first specific column group or bit group fully undergoes shortening according to the predetermined order. In FIG. 9, a third column group or bit group 914 corresponds thereto. If there are any remaining bits to be shortened, a predetermined second specific column group or bit group fully undergoes shortening. In FIG. 9, a $(K_1/M_1-2)$-th column group or bit group 916 corresponds thereto. If there are still any remaining bits to be shortened, a predetermined third specific column group fully undergoes shortening. In FIG. 9, a $(K_1/M_1-3)$-th column group or bit group 915 corresponds thereto. This process is repeated, and if the number of remaining bits to be shortened is less than the size $M_1$ of one column group, a portion of the column group is shortened, completing the shortening process. In FIG. 9, a second column group or bit group 913 corresponds thereto. The predetermined shortening order is called a shortening pattern, which is denoted by indexes of the columns.

In generating an LDPC code having a variable length from a given LDPC code using shortening and puncturing methods, an embodiment of the present invention designs its parity check matrix having an optimal performance for each length. The parity check matrix is designed according to the following rules.

In the description below, it is assumed that a length of a codeword is $N_1$, a codeword length is $K_1$, the number of columns constituting one column group is $M_1$, and the number of column groups of an informant part is $L_1$. In other words, $K_1=M_1 \times L_1$.

Rule 3

To calculate various degree distributions when one column group underwent shortening, up to $(L_1-1)$ column groups undergoing shortening, degree values of column groups and values of the numbers of column groups having the same degree are adjusted and thresholds are calculated for various degree distributions.

The number of column groups of the information part is a value obtained by subtracting the number of shortened columns from $L_1$, and the number of parity groups of the parity part may be determined according to the coding rate.

The degree distribution may be expressed as shown in Equation (9) below.

$$D(x)=f_1x^1+f_2x^2+\ldots+f_nx^n \quad (9)$$

In Equation (9), x may be considered a variable indicating a degree, and $f_i$ denotes a ratio of the number of variable nodes with a degree of i to the total number of variable nodes. More specifically, $f_i$ indicates a ratio of the number of column groups with a degree of i among column groups of a codeword. The column groups of the codeword are subject to change according to the number of column groups undergoing shortening.

The threshold, a Signal to Noise Ratio (SNR) value, indicates that no error may occur in an SNR region greater than or equal to the threshold. The threshold may be a noise variance, and in this case, indicating no error may occur at a noise variance less than or equal to the threshold. There are several possible methods of calculating the threshold. For example, the threshold may be calculated using density evolution or Gaussian approximation method. A detailed description thereof will not be provided herein.

Rule 4

Based on the thresholds for the various degree distributions calculated by Rule 3, distributions with the overall excellent performance are determined taking into account all cases including wherein the number of column groups undergoing shortening is 0, and wherein the number of column groups undergoing shortening is $L_1-1$.

A degree distribution when the number of column groups is S (where $2 \leq S \leq L_1$), should be able to include a degree distribution when the number of column groups is $S-1$. For example, assuming that $D_5(x)=3/5\ x^2+1/5\ x^3+1/5\ x^4$ when the number of column groups is 5, a distribution of $D_4(x)=2/4\ x^2+2/4\ x^3$ may not be selected when the number of column groups is 4. This is because for $D_4(x)$, the number of column groups with a degree of 3 is 2, whereas for $D_5(x)$, the number of column groups with a degree of 3 is reduced to 1. Thus, this case should be excluded.

Rule 5

In a parity check matrix, if its parity part has a dual diagonal structure, the puncturing pattern should be uniform or even.

Figure 10:
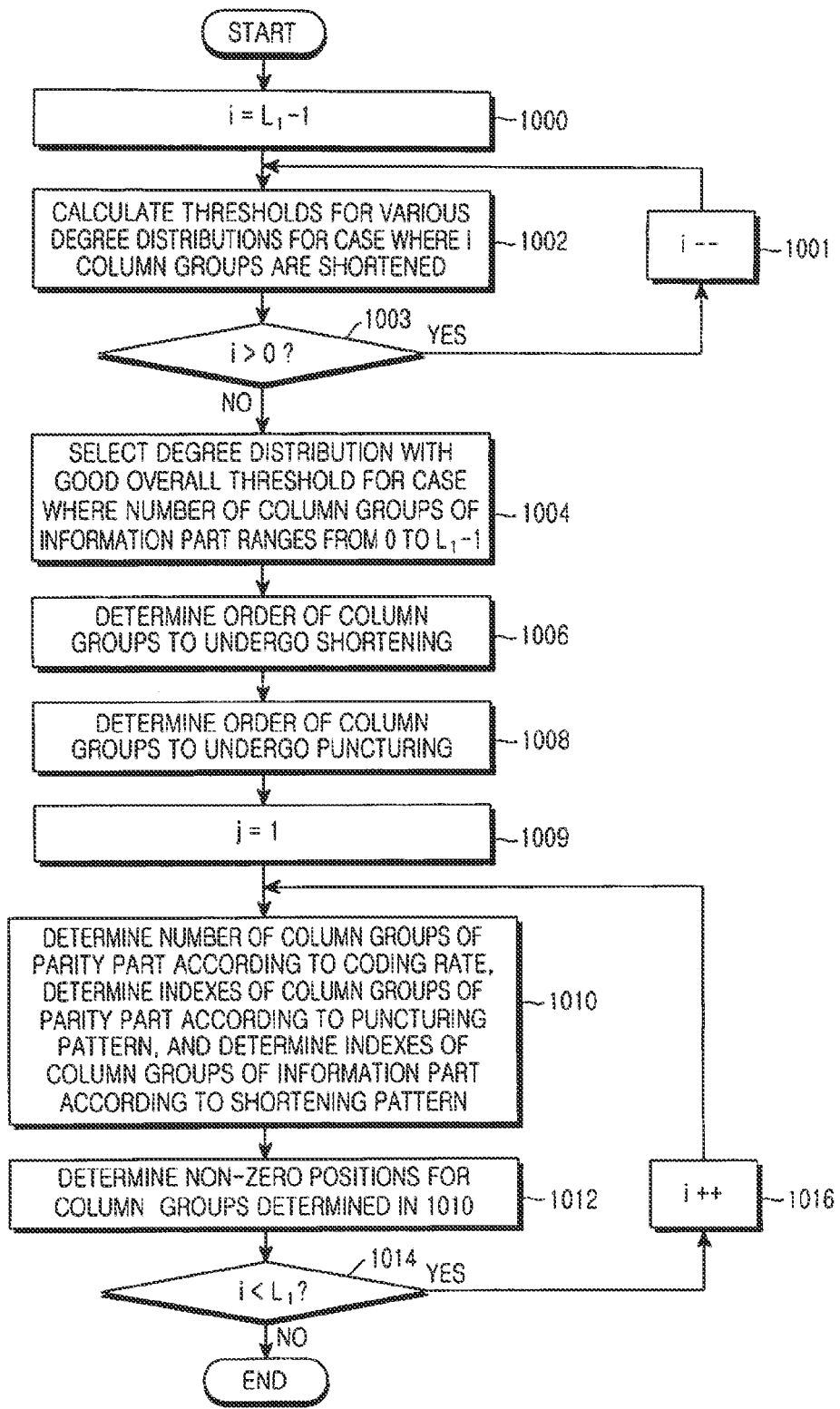
FIG. 10 is a flowchart illustrating a method of determining a parity check matrix supporting various codeword lengths based on Rules 3 to 5, according to an embodiment of the present invention.

FIG. 10 is a flowchart illustrating a method of determining a parity check matrix supporting various codeword lengths based on Rules 3 to 5, according to an embodiment of the present invention Referring to FIG. 10, in step 1000, a controller determines, as $L_1-1$, i indicating the number of column groups undergoing shortening. When the number of column groups undergoing shortening is $L_1-1$, the number of column groups not undergoing shortening is $L_1-(L_1-1)=1$.

In step 1002, the controller calculates various degree distributions for where i column groups underwent shortening, as in Rule 3, and calculates a threshold for each case. For example, thresholds for $i=L_1-1$ may be calculated as shown in Table 1 below. Table 1 shows a table for $i=L_1-1$.

TABLE 1

| i | Degree distribution | Threshold |
|---|---|---|
| $L_1-1$ | $D_{L1-1,0}(x)$ | $Th_{L1-1,0}$ |
| $L_1-1$ | $D_{L1-1,1}(x)$ | $Th_{L1-1,1}$ |
| . | . | . |
| . | . | . |
| . | . | . |
| $L_1-1$ | $D_{L1-1,n}(x)$ | $Th_{L1-1,n}$ |

The controller repeats the above process for up to i=0, and may calculate degree distributions and thresholds as shown in Tables 2 and 3 below for each case.

Table 2 shows a table for $i=L_1-2$. When the number of column groups undergoing shortening is $L_1-2$, the number of column groups not undergoing shortening is $L_1-(L_1-2)=2$.

TABLE 2

| i | Degree distribution | Threshold |
|---|---|---|
| $L_1-2$ | $D_{L1-2,0}(x)$ | $Th_{L1-2,0}$ |
| $L_1-2$ | $D_{L1-2,1}(x)$ | $Th_{L1-2,1}$ |
| . | . | . |
| . | . | . |
| . | . | . |
| $L_1-2$ | $D_{L1-2,m}(x)$ | $Th_{L1-2,m}$ |

Table 3 shows a table for i=0. When the number of column groups undergoing shortening is 0, the number of column groups not undergoing shortening is $L_1-(0)=L_1$.

TABLE 3

| i | Degree distribution | Threshold |
|---|---|---|
| 0 | $D_{0,0}(x)$ | $Th_{0,0}$ |
| 0 | $D_{0,1}(x)$ | $Th_{0,1}$ |
| . | . | . |
| . | . | . |
| . | . | . |
| 0 | $D_{0,1}(x)$ | $Th_{0,1}$ |

In step 1003, the controller determines if i is greater than 0 (i>0). If i>0, the controller gradually decreases i by 1 in step 1001 and then returns to step 1002. However, if i is less than or equal to 0 (i≤0), the controller selects a degree distribution $D_{i,k}(x)$ for each i to ensure the overall excellent performance, for i=0 to $i=L_1-1$, in step 1004. A threshold with a large maximum degree is preferable when not many column groups undergo shortening. However, when many column groups undergo shortening, the large maximum degree may cause significant performance degradation. Accordingly, degree distributions are determined considering when many column groups undergo shortening. Therefore, the degree distributions are determined to ensure an overall excellent performance for i=0 to $i=L_1-1$.

As described above, the degree distribution when the number of column groups is S (where 2≤S≤L) should be able to include a degree distribution for when the number of column groups is S−1. A minimum threshold is determined, which becomes a maximum value for various cases meeting the above relationships.

In step 1006, the controller determines the order of column groups undergoing shortening based on the degree distributions in Tables 1, 2, and 3, for each case where ($L_1-1$) column groups undergo shortening up to where 0 column group undergoes shortening.

For example, when 0 column group undergoes shortening, there are three column groups with a degree of 6 and five column groups with a degree of 3. It will be considered that the column groups with a degree of 6 are $C_0$ $C_1$ $C_2$, and the column groups with a degree of 3 are $C_3$ $C_4$ $C_5$ $C_6$ $C_7$. The degree distributions are determined for each case where 7 column groups undergo shortening up to where 0 column group undergoes shortening, and this is as shown in Table 4 below.

On the assumption that each case has the same coding rate, the number of parity groups of the parity part may be determined. The 'column groups of the parity part' refers to a group of columns in a parity check matrix, which correspond to the bits included in the parity group. The 'number of column groups of the parity part' refers to the number of groups of columns in a parity check matrix, which correspond to the bits included in the parity group. The number of column groups of a codeword is a sum of the number of column groups of the information part and the number of column groups of the parity part.

TABLE 4

| Number of shortened columns | Number (a) of column groups of information part | Number (b) of column groups of parity part | Number (a + b) of column groups of codeword | Degree distribution D(x) |
|---|---|---|---|---|
| 7 | 1 | 4 | 5 | $4/5 x^2 + 1/5 x^3$ |
| 6 | 2 | 8 | 10 | $8/10 x^2 + 1/10 x^3 + 1/10 x^6$ |
| 5 | 3 | 12 | 15 | $12/15 x^2 + 1/15 x^3 + 2/15 x^6$ |
| 4 | 4 | 16 | 20 | $16/20 x^2 + 2/20 x^3 + 2/20 x^6$ |
| 3 | 5 | 20 | 25 | $20/25 x^2 + 3/25 x^3 + 2/25 x^6$ |
| 2 | 6 | 24 | 30 | $24/30 x^2 + 3/30 x^3 + 3/30 x^6$ |
| 1 | 7 | 28 | 35 | $28/35 x^2 + 4/35 x^3 + 3/35 x^6$ |
| 0 | 8 | 32 | 40 | $32/40 x^2 + 5/40 x^3 + 3/40 x^6$ |

Based on the degree distributions in Table 4, the shortening order may be determined as $C_3$ $C_6$ $C_2$ $C_5$ $C_4$ $C_1$ $C_0$ $C_7$. It can be understood that compared with a degree distribution for the case where the number of shortened columns is 0, a degree distribution for the case where the number of shortened columns is 1 is reduced in terms of the numerator of the number with a degree of 3, indicating to shorten column blocks with a degree of 3. $C_3$ may be selected, which is one of the column blocks with a degree of 3. By repeating this process, the shortening order of $C_3$ $C_6$ $C_2$ $C_5$ $C_4$ $C_1$ $C_0$ $C_7$ may be determined. Therefore, the shortening pattern may be a list (3, 6, 2, 5, 4, 1, 0, 7) of index values of the shortening order.

In step 1008, the controller determines the order of parity groups undergoing puncturing. When the parity part has a dual diagonal structure as in Rule 3, positions of columns corresponding to the parity groups undergoing puncturing in the parity check matrix may be uniform. If the parity groups are defined as $P_0 P_1 P_2 P_3 \ldots P_{32} P_{33} P_{34} P_{35}$, the puncturing pattern indicating the puncturing order is (0, 9, 18, 27, 5, 14, 23, 32, 3, 12, 21, 30, 7, 16, 25, 34, 2, 11, 20, 29, 6, 15, 24, 33, 1, 10, 19, 28, 4, 13, 22, 31, 8, 17, 26, 35). The puncturing pattern is a list of indexes of the parity groups undergoing puncturing.

In step 1009, the controller determines if j is 1 (j=1), where j indicates the number of column groups of the information part, which determines non-zero positions. If j=1, the controller determines the number of column groups of the parity part according to the coding rate, and determines indexes of column groups of the parity part according to the puncturing pattern in step 1010. In addition, the controller determines indexes of column groups of the information parts according to the shortening pattern. For example, for the same coding rate of ⅕, four column groups of the parity part may be added every time one column group of the information part is added.

In step 1012, the controller determines non-zero positions in column groups (i.e., i-th column groups) of the information part, which were determined in step 1010. As described above, the non-zero positions in column groups of the parity part may be determined to have a dual diagonal structure.

In designing a parity check matrix of an LDPC code with a long codeword length using the shortening method in FIG. 10, an efficiently designed the LDPC code with a very long codeword length from the small-size parity check matrix is provided, while maintaining the sub-optimized cycle characteristics on the Tanner graph.

Through steps 1014 and 1016, steps 1010 and 1012 are repeated until i=$L_1$.

Figure 11:
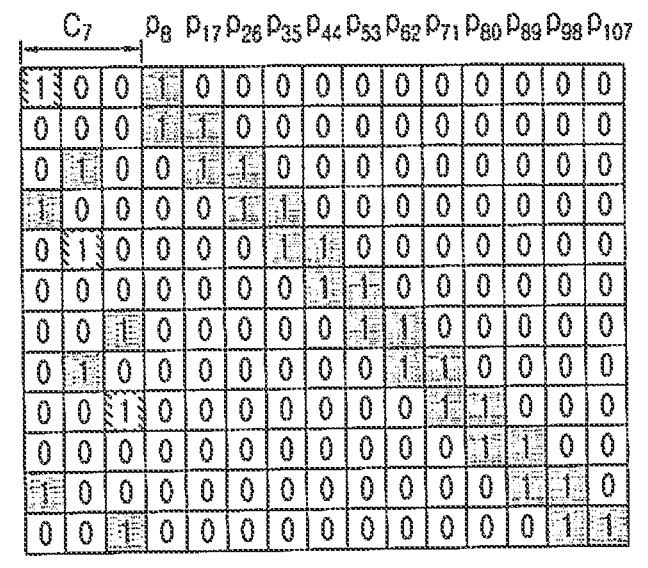

FIG. 11 illustrates a parity check matrix wherein the number of rows with a weight of 1 in each column is 1 (i=1) in a column group of an information part, according to an embodiment of the present invention.

In FIG. 11, it is assumed that, as illustrated above, for a parity check matrix with a coding rate of ⅕, the number of column groups of the information part is 9 and the number of parity groups of the party part is 36. That is, the number of column groups of the parity part is 36. For convenience of description, it is assumed that the size (or number) of columns constituting one column group is 3.

It is also assumed that through steps 1000 to 1004 in FIG. 10, degree distributions of column groups $C_0 C_1 C_2 C_3 C_4 C_5 C_6 C_7$ of the information part are determined as (6 6 6 3 3 3 3 3), and the shortening order is determined as $C_3 C_6 C_2 C_5 C_4 C_1 C_0 C_7$. Therefore, the shortening pattern is (3, 6, 2, 5, 4, 1, 0, 7).

In addition, it is assumed that the puncturing patterns of the parity groups, determined in step 1008, are (0, 9, 18, 27) (5, 14, 23, 32) (3, 12, 21, 30) (7, 16, 25, 34) (2, 11, 20, 29) (6, 15, 24, 33) (1, 10, 19, 28) (4, 13, 22, 31) (8, 17, 26, 35).

Referring to FIG. 11, because the coding rate is ⅕, meaning that every column group of the information part needs 4 parity groups of the parity part, positions with a weight of 1 may be determined for 4 parity groups $P_8, P_{17}, P_{26}, P_{35}$ of the parity part. Parity bits included in the parity group $P_8$ are $(p_8, p_{8+36}, p_{8+36\times2})=(p_8, p_{44}, p_{80})$. Parity bits included in the parity group $P_{17}$ are $(p_{17}, p_{17+36}, p_{17+36\times2})=(p_{17}, p_{53}, p_{89})$. Parity bits included in the parity group $P_{26}$ are $(p_{26}, p_{26+36}, p_{26+36\times2})=(p_{26}, p_{62}, p_{98})$. Parity bits included in the parity group $P_{35}$ are $(p_{35}, p_{35+36}, p_{35+36\times2})=(p_{35}, p_{71}, p_{107})$. As described above, for the parity part, its positions with a weight of 1 are determined to provide a dual diagonal structure.

For i=1, because the number of column groups of the information part is 1, positions with a weight of 1 may be determined for the last column group $C_7$ undergoing shortening. Weights (or degrees) of rows may be as uniform as possible.

Figure 12:
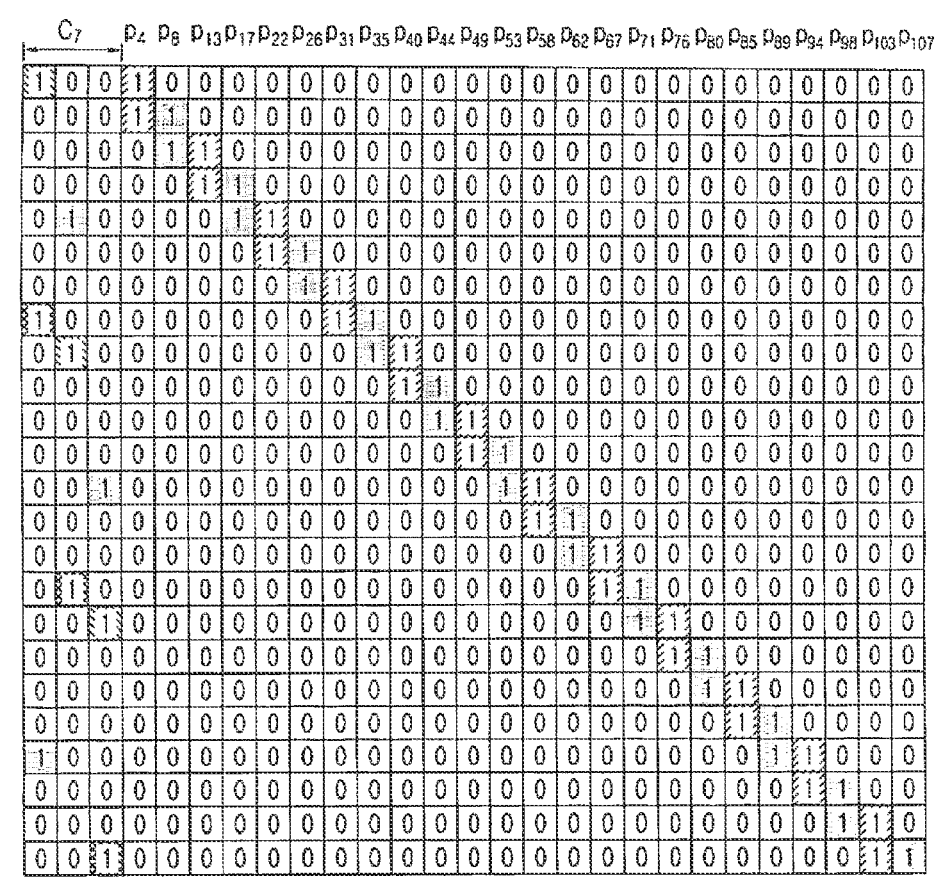

FIG. 12 illustrates a parity check matrix in which 4 parity groups $P_4, P_{13}, P_{22}, P_{31}$ of a parity part are added, where the number of rows with a weight of 1 in each column is 2 (i=2) in a column group of an information part, according to an embodiment of the present invention.

Parity bits included in the parity group $P_4$ are $(p_4, p_{4+36}, p_{4+36\times2})=(p_4, p_{40}, p_{76})$. Parity bits included in the parity group $P_{13}$ are $(p_{13}, p_{13+36}, p_{13+36\times2})=(p_{13}, p_{49}, p_{85})$. Parity bits included in the parity group $P_{22}$ are $(p_{22}, p_{22+36}, p_{22+36\times2})=(p_{22}, p_{58}, p_{94})$. Parity bits included in the parity group $P_{31}$ are $(p_{31}, p_{31+36}, p_{31+36\times2})=(p_{31}, p_{67}, p_{103})$.

When column groups of the parity part are added, the parity check matrix may be extended by edge splitting the existing parity check matrix. The phrase 'edge splitting' refers to a technique of splitting edges of check nodes on the factor graph. In the parity check matrix, one row may be split into two rows, and a non-zero position may be disposed in one of the two split rows. When 4 column groups of the parity part are added, the number of rows of the new parity check matrix is twice that of the existing parity check matrix. That is, one row in the existing parity check matrix is split into two rows in the new parity check matrix. A position with a weight of 1 is mapped to one of the two rows. Even in this case, weights (or degrees) of rows may be as uniform as possible.

Figure 13:
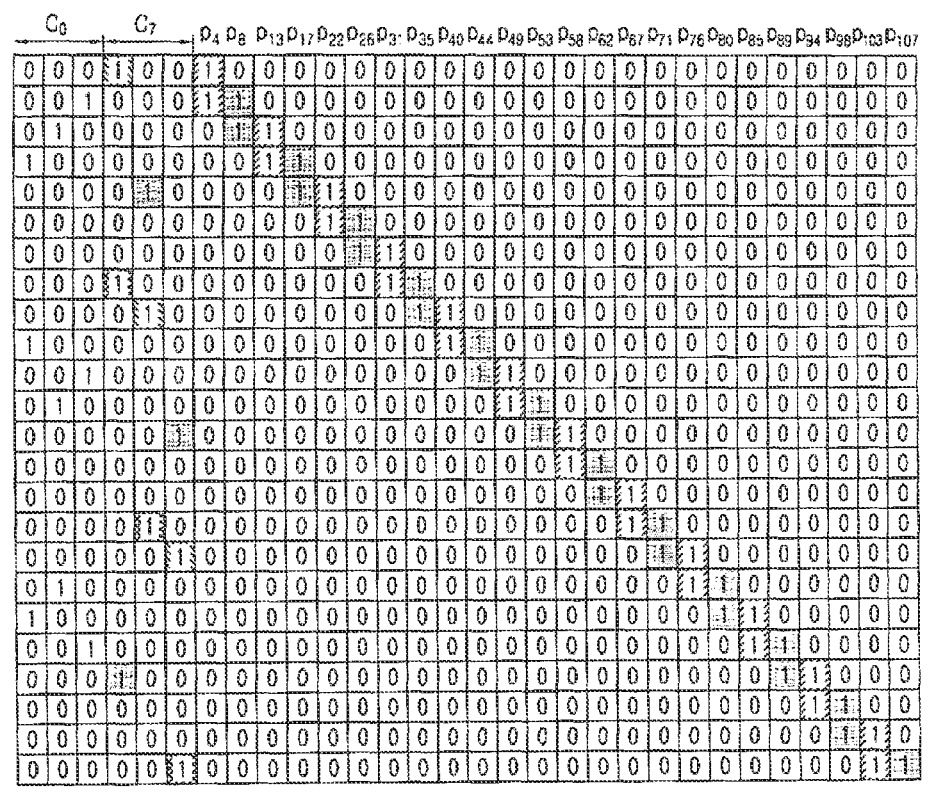

FIG. 13 illustrates a parity check matrix in which a column group $C_0$ of an information part is added, based on the parity check matrix of FIG. 12, according to an embodiment of the present invention. Even in this case, weights (or degrees) of rows may be as uniform as possible.

A method of adding column groups of the information part and the parity part has been described above. Accordingly, a repetitive description will be omitted here.

Examples of a parity check matrix will be given below, which is generated by the above-described rules and order for the parity check matrix generation method.

Example 1

For $N_1$=4320, $K_1$=630, $M_1$=90, q=7, and R=7/48, a shortening pattern and a puncturing pattern are shown below, where $N_1$ represents a length of an LDPC codeword, $K_1$ represents a length of an information word, $M_1$ represents the number of column groups, q represents an integer meeting $q=(N_1-K_1)/M_1$, and R represents a coding rate.

Shortening pattern: (5, 4, 2, 3, 1, 6, 0)

Puncturing pattern: (29, 4, 1, 17, 38, 28, 9, 12, 19, 31, 33, 36, 14, 6, 18, 7, 20, 0, 13, 23, 26, 2, 10, 21, 27, 35, 3, 15, 25, 37, 8, 24, 39, 16, 34, 22, 5, 40, 11, 32, 30)

Position information of rows with a weight of 1 in 0-th columns in column groups of an information part of the parity check matrix is as follows:

117 555 696 701 848 943 1145 1164 1212 1488 1583 1707 1922 2180 2430 2862

62 325 411 558 705 1577 1594 2053 2452 2548 2733 2844 2901 2976 3543 3659

184 321 360 663 790 849 1461 1576 1847 2418 2538 2555 2721 3203 3466 3494

1078 2110 2620

2429 2868 3636

922 1849 3597

527 2894 3335

Example 2

For $N_1$=4320, $K_1$=1800, $M_1$=90, q=20, R=20/48, a shortening pattern and a puncturing pattern are shown below, where $N_1$ represents a length of an LDPC codeword, $K_1$ represents a length of an information word, $M_1$ represents the number of column groups, q represents an integer meeting q=$(N_1-K_1)/M_1$, and R represents a coding rate.

Shortening pattern: (18, 17, 16, 15, 4, 14, 13, 12, 3, 11, 10, 9, 2, 8, 7, 6, 5, 1, 19, 0)

Puncturing pattern: (20, 23, 8, 0, 2, 15, 4, 21, 13, 10, 17, 26, 7, 25, 18, 12, 22, 27, 6, 3, 16, 11, 5, 14, 1, 9, 19, 24)

Position information of rows with a weight of 1 in 0-th columns in column groups of an information part of the parity check matrix is as follows:

298 457 517 702 906 915 1044 1117 1147 1183 1210 1288 1375 1724 2204 2283 2292 2364

229 278 329 367 394 729 1333 1387 1412 1474 1518 1806 1814 1852 2044 2197 2223 2431

75 257 374 380 639 728 824 918 1077 1101 1106 1119 1654 1921 2042 2370 2384 2489

70 199 260 279 371 472 480 538 664 717 862 1163 1298 1369 1495 1594 1765 2009

117 375 558 755 792 915 1400 1413 1435 1451 1605 1905 1981 2120 2284 2367 2377 2460

500 789 1042

712 1249 1771

467 2130 2274

725 1545 2479

1090 1855 2212

1045 1620 2295

292 387 797

1326 1446 2203

1065 1856 2114

1654 1992 2038

720 744 1851

129 2355 2444

130 449 1068

554 826 2149

1864 1943 1970

Example 3

For $N_1$=16200, $K_1$=2520, $M_1$=360, q=7, R=7/45, a shortening pattern and a puncturing pattern are shown below, where $N_1$ represents a length of an LDPC codeword, $K_1$ represents a length of an information word, $M_1$ represents the number of column groups, q represents an integer meeting q=$(N_1-K_1)/M_1$, and R represents a coding rate.

Shortening pattern: (2, 5, 4, 1, 3, 6, 0)

Puncturing pattern: (10, 18, 26, 37, 4, 13, 23, 31, 7, 21, 29, 34, 1, 12, 15, 36, 6, 17, 25, 32, 2, 9, 20, 28, 0, 8, 16, 24, 33, 3, 11, 19, 27, 35, 5, 14, 22, 30)

Position information of rows with a weight of 1 in 0-th columns in column groups of an information part of the parity check matrix is as follows:

495 2553 3717 3788 4423 5063 7884 8304 9322 12122 12460 12986

643 2098 2221 3138 5550 5944 9339 10179 11140 11337 12918 13021

2446 2603 5938 7979 8343 8485 8916 9451 11774 12031 12125 13343

173 7098 10301

6161 12326 13286

8713 9641 13636

3544 4412 11917

Example 4

For $N_1$=16200, $K_1$=2880, $M_1$=360, q=8, R=8/45, a shortening pattern and a puncturing pattern are shown below, where $N_1$ represents a length of an LDPC codeword, $K_1$ represents a length of an information word, $M_1$ represents the number of column groups, q represents an integer meeting q=$(N_1-K_1)/M_1$, and R represents a coding rate.

Shortening pattern: (6, 2, 5, 4, 1, 3, 7, 0)

Puncturing pattern: (0, 10, 18, 24, 4, 14, 20, 30, 8, 16, 28, 34, 2, 12, 22, 32, 6, 17, 26, 36, 5, 13, 25, 33, 1, 9, 21, 29, 3, 15, 27, 7, 19, 31, 11, 23, 35)

Position information of rows with a weight of 1 in 0-th columns in column groups of an information part of the parity check matrix is as follows:

800 1553 2297 3620 3894 3978 4155 5207 6911 9345 12373 13179

625 4224 5317 7047 7894 8141 8754 9077 9349 11771 12097 12131

1097 1286 3788 5395 5547 5809 8662 8814 8859 9474 10185 12304

598 8084 10876

2533 3450 6097

8642 9910 11142

167 11038 12576

570 9387 10030

Figure 14:
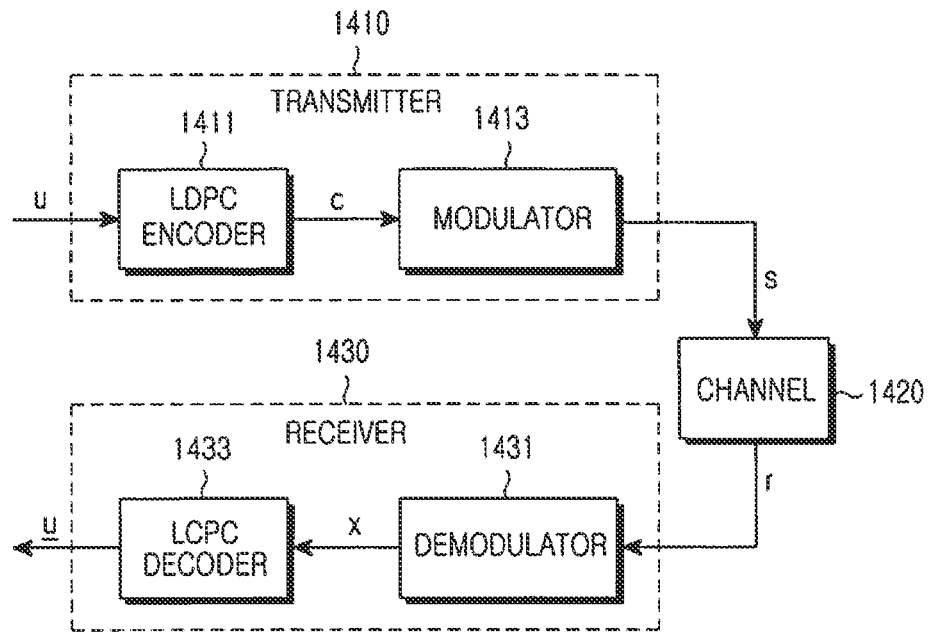
FIG. 14 is a block diagram illustrating a transceiver in a communication system using an LDPC code according to an embodiment of the present invention.

FIG. 14 is a block diagram illustrating a transceiver in a communication system using an LDPC code according to an embodiment of the present invention.

Referring to FIG. 14, a message u is coded by an LDPC coder 1411 in a transmitter 1410 before being transmitted. The coded signal c is modulated by a modulator 1413, and signal s transmitted over a wireless channel 1420. A demodulator 1431 in a receiver 1430 demodulates a signal r received over the wireless channel 1420. An LDPC decoder 1433 estimates an estimate u̲ of a message x from the demodulated data.

The LDPC coder 1411 and the LDPC decoder 1433 perform coding and decoding by selecting a parity check matrix according to the block length required in the communication system using a predetermined method. In accordance with an embodiment of the present invention, the LDPC coder 1411 and the LDPC decoder 1433 support various block lengths using only a parity check matrix of an LDPC code with the longest block length, without separately storing parity check matrixes of LDPC codes with various block lengths.

Figure 15:
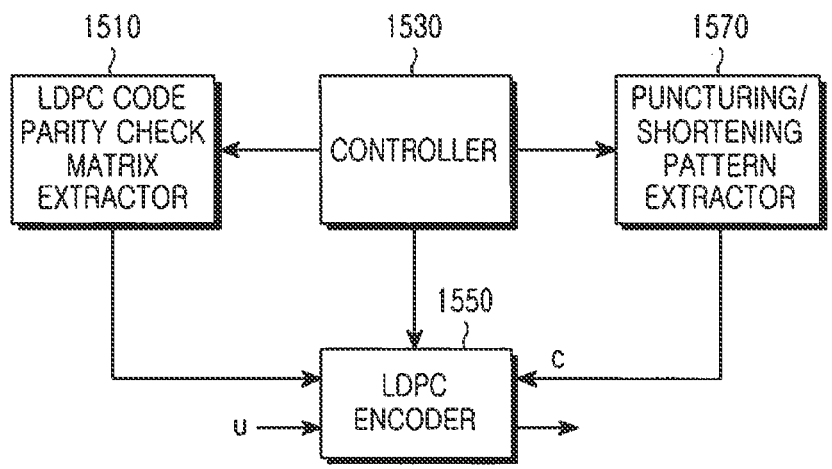
FIG. 15 is a block diagram illustrating a transmitter using an LDPC code according to an embodiment of the present invention.

FIG. 15 is a block diagram illustrating a transmitter using an LDPC code generated according to an embodiment of the present invention.

Referring to FIG. 15, the transmitter includes an LDPC code parity check matrix extractor 1510, a controller 1530, an LDPC coder 1550, and a puncturing/shortening pattern extractor 1570.

The LDPC code parity check matrix extractor 1510 extracts a parity check matrix of an LDPC code according to the requirements of the communication system.

The parity check matrix of an LDPC code may be extracted using a parity check matrix generation method, or may be extracted from a memory in which the parity check matrix generation is stored in advance. Alternatively, the parity check matrix may be given in, or generated by the transmitter. Parity check matrix information may be a portion of the parity check matrix, and may include parameters (e.g., information about weight-1 position sequences, a length of column groups of the parity check matrix, and the number of column groups) of the parity check matrix.

The controller 1530 may determine a required parity check matrix with a specific codeword length or information word length according to the system requirements. More specifically, the controller 1530 determines degrees for a plurality of column groups in the parity check matrix. The degrees may be defined as shown above in Tables 1, 2, and 3.

The LDPC coder 1550 performs coding based on information about the parity check matrix of an LDPC code, which is read by the controller 1530, the LDPC code parity check matrix extractor 1510, and the puncturing/shortening pattern extractor 1570.

The puncturing/shortening pattern extractor 1570 determines a shortening pattern depending on the degrees, and performs column-group by column-group shortening using the determined shortening pattern.

Figure 16:
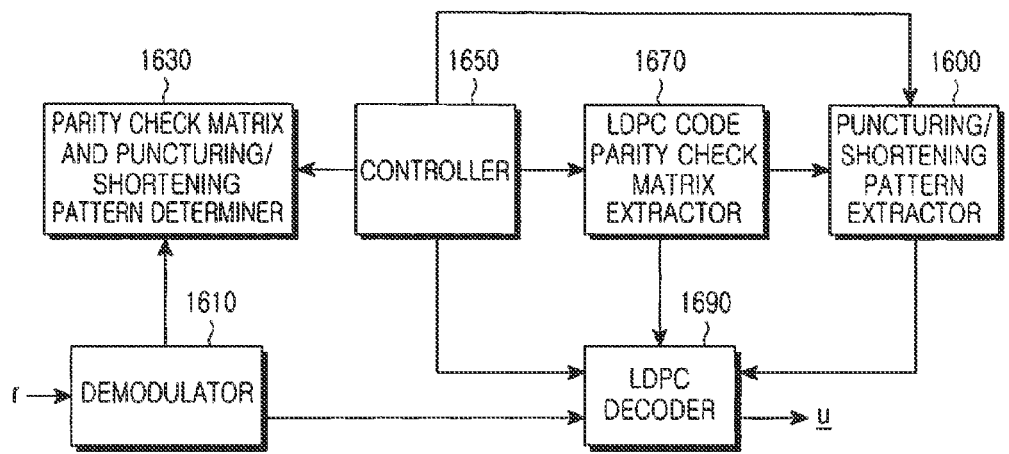
FIG. 16 is a block diagram illustrating a receiver using an LDPC code according to an embodiment of the present invention.

FIG. 16 is a block diagram illustrating a receiver according to an embodiment of the present invention, in which the receiver receives a signal transmitted from a communication system using the re-designed LDPC code, and restores user-desired data from the received signal.

Referring to FIG. 16, the receiver includes a demodulator 1610, a parity check matrix and puncturing/shortening pattern determiner 1630, an LDPC code parity check matrix extractor 1670, a controller 1650, an LDPC decoder 1690, and a puncturing/shortening pattern extractor 1600.

The demodulator 1610 receives and demodulates an LDPC code, and provides the demodulated signal to the parity check matrix and puncturing/shortening pattern determiner 1630 and the LDPC decoder 1690.

Under control of the controller 1650, the parity check matrix and puncturing/shortening pattern determiner 1630 determines a parity check matrix of an LDPC code used in the system based on the demodulated signal.

The controller 1650 analyzes or estimates information about a shortening pattern of an LDPC code from the demodulated signal, based on the determination results by the parity check matrix and puncturing/shortening pattern determiner 1630, and provides estimated information to the LDPC code parity check matrix extractor 1670, the LDPC decoder 1690, and the puncturing/shortening pattern extractor 1600, to determine the positions of shortened bits. The information about a shortening pattern may refer to a shortening pattern based on degrees for a plurality of column groups.

The LDPC code parity check matrix extractor 1670, under control of the controller 1650, extracts a parity check matrix of an LDPC code required in the system, and provides the extracted parity check matrix to the LDPC decoder 1690. The parity check matrix of an LDPC code may be extracted using a parity check matrix generation method, or may be extracted from a memory in which the parity check matrix generation is stored in advance. Alternatively, the parity check matrix may be given in, or generated by the transmitter.

The LDPC decoder 1690, under control of the controller 1650, performs decoding based on the received signal provided from the demodulator 1610 and the information about the parity check matrix of an LDPC code, which are provided from the LDPC code parity check matrix extractor 1670 and the puncturing/shortening pattern extractor 1600.

Figure 17:
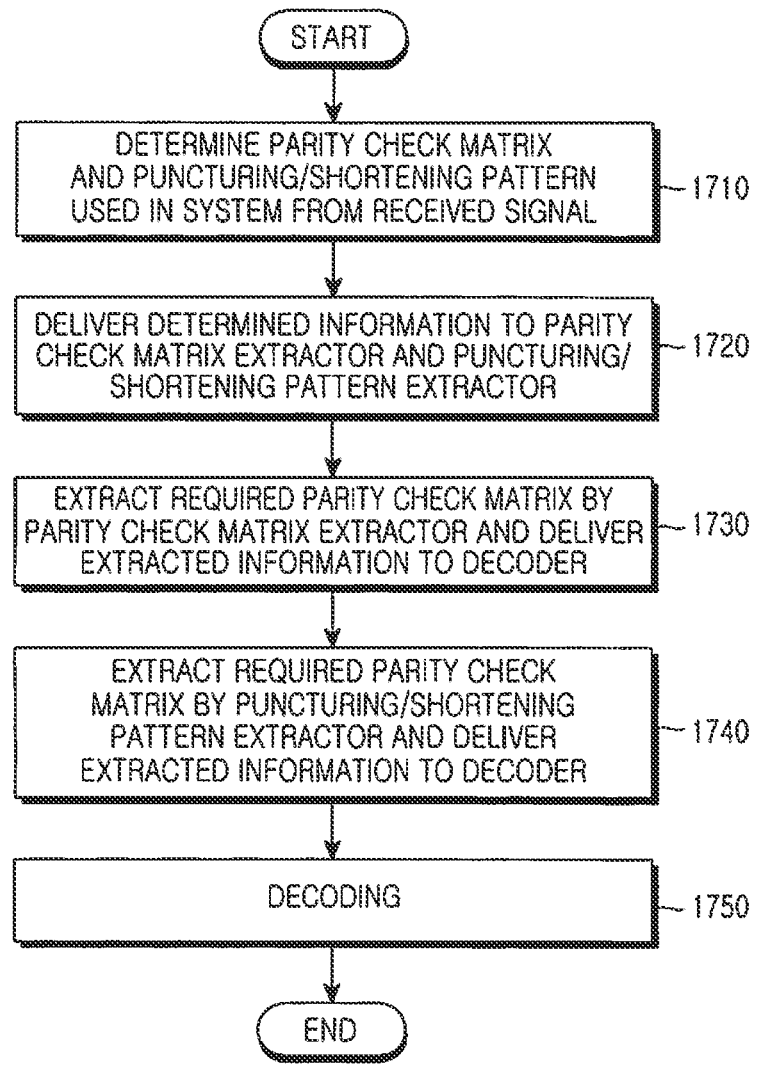
FIG. 17 is a flowchart illustrating a reception operation in a receiver using an LDPC code according to an embodiment of the present invention.

FIG. 17 illustrates a reception operation of a receiver according to an embodiment of the present invention.

Referring to FIG. 17, in step 1710, a parity check matrix and puncturing/shortening pattern determiner 1630 determines a parity check matrix and a puncturing/shortening pattern used in the system from a received signal. In step 1720, the parity check matrix and puncturing/shortening pattern determiner 1630 provides the determined information to an LDPC code parity check matrix extractor 1670 and a puncturing/shortening pattern extractor 1600. In step 1730, the LDPC code parity check matrix extractor 1670 extracts a required parity check matrix and provides information about it to an LDPC decoder 1690. In step 1740, the puncturing/shortening pattern extractor 1600 extracts a required puncturing/shortening pattern and provides information about it to the LDPC decoder 1690. In step 1750, the LDPC decoder 1690 performs decoding.

As is apparent from the foregoing description, embodiments of the present invention generate LDPC codes with various information word lengths using a given parity check matrix and a shortening method in a communication system employing an LDPC code.

Further, LDPC codes can be generated with various codeword lengths using information about a given parity check matrix in a communication system employing an LDPC code.

Accordingly, embodiments of the present invention efficiently design a parity check matrix of an LDPC code, whose codeword length is relatively long, from a parity check matrix whose codeword length is relatively short, while maintaining the sub-optimized cycle characteristics on the Tanner graph.

While the present invention has been shown and described with reference to certain embodiments thereof, it will be understood by those skilled in the art that various changes in form and details may be made therein without departing from the spirit and scope of the present invention as defined by the appended claims and their equivalents.

What is claimed is:

1. A method of channel coding in a communication system using a Low-Density Parity-Check (LDPC) code, the method comprising:
    determining degrees for each of a plurality of column groups of an information part;
    determining a shortening order based on the degrees;
    generating a parity check matrix based on the shortening order;
    performing coding of a signal using the parity check matrix; and
    transmitting the coded signal.

2. The method of claim 1, wherein each of the plurality of column groups of the information part has a variable length.

3. The method of claim 1, wherein the degrees for the plurality of column groups of the information part are determined according to a change in a number of column groups of the information part, which have a same degree.

4. The method of claim 1, further comprising determining a puncturing order of a parity part based on the shortening order.

5. The method of claim 4, wherein the puncturing order is uniform when the parity part has a dual diagonal structure.

6. The method of claim 1, further comprising determining a puncturing order of a parity part according to a coding rate.

7. The method of claim 1, wherein a column group of a parity part includes a group of columns of the parity check matrix, which correspond to bits included in a parity group of the parity part, and a column group of the information part includes a group of columns of the parity check matrix, which correspond to bits included in the column group of the information part.

8. The method of claim 1, further comprising:
    determining a degree distribution for the plurality of column groups of the information part; and
    determining the shortening order based on the degree distribution.

9. An apparatus for channel coding in a communication system using a Low-Density Parity-Check (LDPC) code, the apparatus comprising:

a controller for determining degrees for each of a plurality of column groups of an information part, and determining a shortening order based on the degrees;

a coder for generating a parity check matrix based on the shortening order, and performing coding of a signal using the parity check matrix; and a transmitter for transmitting the coded signal.

10. The apparatus of claim 9, wherein each of the plurality of column groups of the information part has a variable length.

11. The apparatus of claim 9, wherein the degrees are determined according to a change in a number of column groups of the information part, which have a same degree.

12. The apparatus of claim 9, wherein a puncturing order of a parity part is determined based on the shortening order.

13. The apparatus of claim 12, wherein the puncturing order is uniform when the parity part has a dual diagonal structure.

14. The apparatus of claim 9, wherein a puncturing order of a parity part is determined according to a coding rate.

15. The apparatus of claim 9, wherein a column group of a parity part includes a group of columns of the parity check matrix, which correspond to bits included in a parity group of the parity part, and a column group of the information part includes a group of columns of the parity check matrix, which correspond to bits included in the column group of the information part.

16. The apparatus of claim 9, wherein the controller is further configured to determine a degree distribution for the plurality of column groups of the information part, and determine the shortening order based on the degree distribution.

17. A method of channel decoding in a communication system using a Low-Density Parity-Check (LDPC) code, the method comprising:

receiving a coded signal from a transmitter; and decoding the received signal using a parity check matrix, wherein the parity check matrix is generated by determining degrees for each of a plurality of column groups of an information part, and determining a shortening order based on the degrees.

18. The method of claim 17, wherein each of the plurality of column groups of the information part has a variable length.

19. The method of claim 17, wherein the degrees for the plurality of column groups of the information part are determined according to a change in a number of column groups of the information part, which have a same degree.

20. The method of claim 17, wherein a puncturing order of a parity part is determined based on the shortening order.

21. The method of claim 20, wherein the puncturing order is uniform when the parity part has a dual diagonal structure.

22. The method of claim 17, wherein a puncturing order of a parity part is determined according to a coding rate of the coded signal.

23. The method of claim 17, wherein a column group of the parity part includes a group of columns of the parity check matrix, which correspond to bits included in a parity group of the parity part, and a column group of the information part includes a group of columns of the parity check matrix, which correspond to bits included in the column group of the information part.

24. The method of claim 17, further comprising:

determining a degree distribution for the plurality of column groups of the information part; and determining the shortening order based on the degree distribution.

25. An apparatus for channel decoding in a communication system using a Low-Density Parity-Check (LDPC) code, the apparatus comprising:

a receiver for receiving a coded signal from a transmitter; and a decoder for decoding the received signal using a parity check matrix, wherein the parity check matrix is generated by determining degrees for each of a plurality of column groups of an information part, and determining a shortening order based on the degrees.

26. The apparatus of claim 25, wherein each of the plurality of column groups of the information part has a variable length.

27. The apparatus of claim 25, wherein the degrees for the plurality of column groups of the information part are determined according to a change in a number of column groups of the information part, which have a same degree.

28. The apparatus of claim 25, wherein a puncturing order of a parity part is determined based on the shortening order.

29. The apparatus of claim 25, wherein a puncturing order of a parity part is determined according to a coding rate of the coded signal.

30. The apparatus of claim 25, wherein the shortening order is based on a degree distribution that is determined for the plurality of column groups of the information part.

* * * * *